United States Patent [19]
Husher

[11] Patent Number: 5,179,432
[45] Date of Patent: Jan. 12, 1993

[54] INTEGRATED PNP POWER BIPOLAR TRANSISTOR WITH LOW INJECTION INTO SUBSTRATE

[75] Inventor: John Husher, Los Altos Hills, Calif.

[73] Assignee: Micrel, Inc., Sunnyvale, Calif.

[21] Appl. No.: 745,318

[22] Filed: Aug. 15, 1991

[51] Int. Cl.$^5$ .................. H01L 29/72; H01L 27/02; H01L 27/04

[52] U.S. Cl. .................. 257/593; 257/546; 257/552; 257/578

[58] Field of Search .................. 357/34, 35, 43, 48, 357/86

[56] References Cited

U.S. PATENT DOCUMENTS

| | | | |
|---|---|---|---|
| 4,081,697 | 3/1978 | Nakano | 357/35 |
| 4,272,307 | 6/1981 | Mayrand | 148/187 |
| 4,979,008 | 12/1990 | Siligoni et al. | 357/34 |

FOREIGN PATENT DOCUMENTS 0258865  2/1990  Japan .................. 357/35

OTHER PUBLICATIONS

Mike F. Chang et al., "Lateral HVIC with 1200-V Bipolar and Field Effect Devices," pp. 167-176 (reprint from IEEE Trans. Electron Devices, vol. ED-33, pp. 1992-2001, Dec. 1986).

B. Jayant Baliga, "Power Integrated Circuits—A Brief Overview," pp. 34-36 (reprint from IEEE Trans. Electron Devices, vol. ED-33, No. 12, pp. 1936-1939, Dec. 1986).

*Primary Examiner*—Rolf Hille
*Assistant Examiner*—Wael Fahmy
*Attorney, Agent, or Firm*—Skjerven, Morrill, MacPherson, Franklin & Friel

[57] ABSTRACT

In one embodiment of the invention, a P buried region is formed in an N epitaxial layer and isolated from a P substrate by an N buried region. P+ emitters and P+ collectors are formed in the surface of the N epitaxial layer (acting as a base). The P buried region acts as a catch diffusion for minority hole carriers injected into the epitaxial layer by the surface emitters that escape collection by the surface P+ collectors and which would otherwise be injected into the substrate. The N buried region effectively isolates the P buried region from the P substrate and further blocks any minority carriers from being injected into the substrate. The P buried region also prevents the formation of a parasitic PNP transistor to the substrate of the integrated device. This further reduces substrate current and thus further reduces the possibility of noise and latchup. The resulting structure is an efficient high power integrated PNP bipolar transistor capable of being incorporated in integrated circuits with very sensitive low power logic devices.

5 Claims, 3 Drawing Sheets

INTEGRATED PNP POWER BIPOLAR TRANSISTOR WITH LOW INJECTION INTO SUBSTRATE

FIELD OF THE INVENTION

This invention relates to integrated bipolar transistors, and more particularly, to high power, integrated, lateral, PNP bipolar transistors formed in a silicon substrate.

BACKGROUND OF THE INVENTION

FIG. 1 shows a typical prior art, high power, lateral, integrated PNP transistor. In the exemplary device of FIG. 1, a P substrate 10 has an N epitaxial layer 20 formed thereon. A highly doped P+ emitter 30 is formed in the surface of epitaxial layer 20.

Surrounding P+ emitter 30, but separated therefrom by a portion of N epitaxial layer 20, is a P+ collector 40.

To turn the PNP bipolar transistor on, the P+ emitter 30 is forward biased with respect to the N epitaxial layer 20, acting as a base, while P+ collector 40 is reverse biased with respect to the base.

To provide an ohmic connection to the base region of the transistor, a highly doped N+ contact region 50 may be formed on the surface of epitaxial layer 20.

When the transistor is biased on, there will be a minority carrier hole current in N epitaxial layer 20 due to the forward biasing of the P+ emitter 30 with respect to N epitaxial layer 20. Most of these minority carrier holes injected into epitaxial layer 20 will be collected by the P+ collector 40, having a negative voltage applied thereto with respect to the epitaxial layer 20 base. A small portion of these holes will be withdrawn via N+ contact 50 as base current.

Ideally, all holes injected by the emitter 30 into N epitaxial layer 20 will be withdrawn by either the collector 40 or the base contact 50. However, as the flow of holes shown in dashed lines in FIG. 1 illustrates, without any buried region, the electrical fields created by the biasing of the device and the proximity of the substrate to emitter 30 results in a small flow of holes reaching the epitaxial layer/substrate interface and being injected into substrate 10. This hole current will then flow through substrate 10 to a terminal connected to the substrate. Such a hole current in P substrate 10 generates a voltage differential within the substrate which may affect other devices formed in the substrate in the form of cross-talk (modulation), noise, or latchup. Further, substrate current wastes power and generates heat.

In an attempt to block these minority carriers from entering the substrate, the prior art forms a highly doped buried region, such as N+ buried region 60 in FIG. 1. Most holes injected into N+ buried region 60 are recombined in N+ buried region 60 and consequently do not penetrate into substrate 10. Although, N+ buried region 60 desirably reduces substrate current, the holes injected into N+ buried region 60 undesirably constitute a loss of current and hence a lowering of the beta of the primary lateral PNP transistor.

N+ buried region 60 also acts to reduce the beta of any parasitic transistor formed where the P substrate 10 acts as an emitter or collector of the parasitic transistor. However, there still exists a parasitic PNP transistor to the substrate.

P+ isolation diffusions 70 isolate the area of the epitaxial layer containing the lateral integrated PNP transistors.

If N+ buried region 60 is connected to a base terminal via N+ sinkers 80, this would allow buried region 60 to act as an additional base contact region. By connecting buried region 60 to the base terminal, N+ base contact region 50 may be deleted if the substrate can serve as a common node or ground.

As is well known, as the thickness of N epitaxial layer 20 decreases, or the distance between the emitter 30 and collector 40 are spaced further apart to achieve desired operating characteristics, more and more minority carriers will be injected into any buried layer, thus undesirably reducing the beta and efficiency of the lateral PNP transistor. Further, a percentage of these minority carriers will be undesirably injected into the substrate, creating a substrate current.

In addition to the leakage to the substrate as indicated, integrated power PNP transistors incorporating an N buried layer inherently include a parasitic PNP to the substrate, with the surface P+ region serving as the emitter, the N epitaxial and buried layer acting as a base, and the P substrate acting as a collector. Where the prime power transistor is handling 3.5 amps, if the parasitic transistor only has a beta of 0.1, it will result in 350 ma being dumped into the substrate.

With low voltage or low power PNP bipolar transistors, such as those operating at under 10 volts or under 1 ma of current, the proximity of the emitter and collector regions, the shallow depth of these regions relative to the epitaxial layer thickness, the low currents involved, and the low electric fields generated cause very few minority carriers to be injected into the substrate. Thus, the added expense of forming a buried layer, such as buried layer 60 in FIG. 1, is not justified in many cases.

FIG. 2 illustrates a conventional low voltage, integrated NPN bipolar transistor using a buried N collector region 84, but such a structure is clearly unsuitable for forming PNP devices in an N epitaxial layer and unsuitable for high voltage applications due to the relatively narrow width of the diffused P base region 86.

Forming a number of high power, integrated bipolar transistors in parallel on a single chip would increase any undesirable substrate current, and the undesirable effects of substrate current will be exacerbated.

Further, in such applications where high power, integrated devices are formed on the same integrated circuit as low voltage devices, such as where the high power devices act as a high power output circuit under control of logic circuitry on the same chip, the problems with substrate current from high power devices and the parasitic PNP action to the substrate are extremely significant due to the sensitivity of the low voltage logic devices to variations in substrate current.

What is needed is an efficient, high power, integrated PNP bipolar transistor structure which virtually eliminates any undesirable current in the substrate and any parasitic PNP action so that these high power devices may be incorporated on integrated circuits with very sensitive low power logic devices.

SUMMARY OF THE INVENTION

In one embodiment of the invention, a P buried region (also referred to as a catch diffusion region) is formed in an N epitaxial layer and isolated from a P substrate by an N buried region. P+ emitters and P+ collectors are formed in the surface of the N epitaxial layer (acting as a base). The P catch diffusion region acts as a collector for minority hole carriers injected into the epitaxial layer by the emitter that escape collection by the surface P+ collectors. Vertical P+ sinkers contacting the P catch diffusion region are electrically connected to a collector terminal so that all current collected by the catch diffusion region can be returned as collector current, thus providing a very efficient PNP transistor. The N buried layer effectively isolates the P catch diffusion region from the P substrate and further blocks any minority carriers from being injected into the substrate.

The resulting structure forms a device wherein minority carriers are caught and thus essentially totally blocked from entering the substrate. Those carriers which are caught become part of the useful collector current. The resulting structure also eliminates the parasitic PNP transistor to the substrate, thus eliminating another source of current in the substrate. Since carrier injection into the substrate is no longer a problem, the epitaxial layer may be made thinner. This enables the device to be made cheaper and reduces the likelihood of faults in the epitaxial layer.

DETAILED DESCRIPTION OF THE PREFERRED EMBODIMENT

Figure 3:
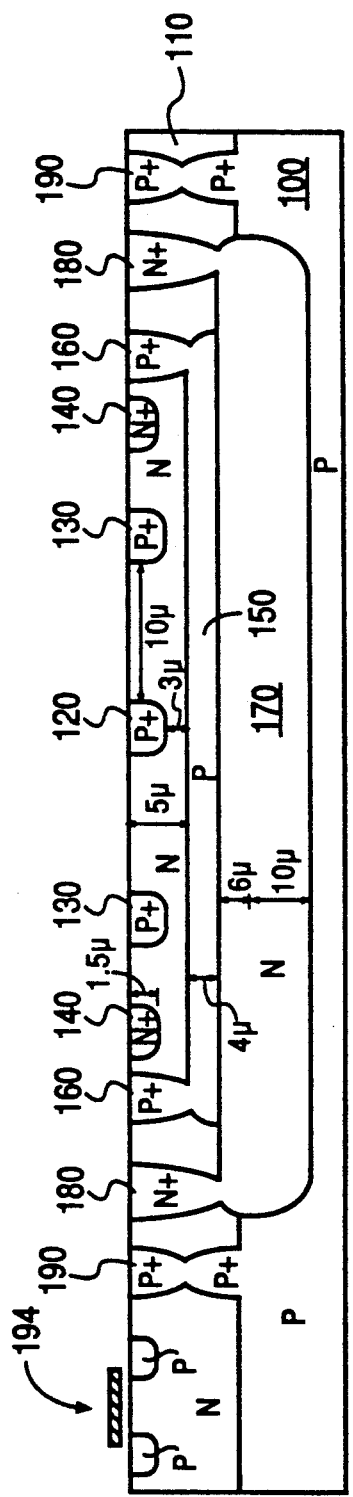
FIG. 3 illustrates a preferred embodiment of the invention as an integrated PNP power bipolar transistor.

FIG. 3 shows the preferred embodiment of the invention, which is a high power, integrated, lateral, PNP bipolar transistor. In this embodiment, a P substrate 100 has formed on it an N epitaxial layer 110 of a suitable thickness and doping concentration, dependent upon the required device operating characteristics.

A highly doped P+ emitter region 120 is formed in the surface of epitaxial layer 110. An annular P+ collector region 130 is then formed in the surface of epitaxial layer 110 and spaced apart from P+ emitter 120 by the appropriate distance as dictated by the desired operating characteristics of the device. An annular N+ base contact region 140 is then formed to provide ohmic contact to the N epitaxial layer 110. For simplicity, only a single emitter with one annular collector is shown. For a high power device there may be multiple emitters and collectors formed using several approaches which would be apparent to those of ordinary skill in the art after reading this disclosure.

A P diffused region 150 is formed at the boundary of N epitaxial layer 110 and P substrate 100 as a buried collector region (or catch diffusion region) to collect minority carriers injected into N epitaxial layer 110 by P+ emitter 120 that were not collected by the surface collector region 130. If the distance of P catch diffusion region 150 from P+ emitter 120 is substantially shorter than the distance between P+ emitter 120 and lateral P+ collector regions 130, collector regions 130 may be eliminated since the majority of the collector current will be through P catch diffusion region 150. P catch diffusion region 150 may be electrically connected, via annular P+ sinker region (or return region) 160, to the collector terminal of the transistor. This allows the carriers collected by P catch diffusion region 150 to become part of the useful total collector current of the transistor.

Due to the collector action of P catch diffusion region 150, there will be very little injection of carriers through P catch diffusion region 150 into N buried region 170 and into P substrate 100. P catch diffusion region 150 also effectively eliminates the formation of any parasitic PNP transistors.

Even for a power PNP transistor with many surface emitters and collectors, only one catch region needs to be formed; thus the size of the transistor is not significantly increased by incorporating P catch diffusion region 150.

N buried region 170 is formed to completely insulate P catch diffusion region 150 from P substrate 100. N buried region 170 must be of a sufficient thickness and doping concentration to provide the required breakdown voltage between P catch diffusion region 150 and P substrate 100.

N buried region 170 may float or, optionally, N+ buried region 170 may be contacted by N+ sinker 180 to enable N+ buried region 170 to be appropriately reverse biased with respect to P catch diffusion region 150, such as by connecting N+ sinker 180 to the base bias potential.

P+ isolation diffusions 190 may be formed in epitaxial layer 110 to isolate the resulting transistor from other devices, such as MOSFET 194, formed in epitaxial layer 110.

In the embodiment shown in FIG. 3, the resulting integrated, PNP bipolar transistor has the characteristics of both a lateral and a vertical bipolar transistor, thus providing two parallel paths for the collector current (and a lower on-resistance) and thus providing a highly efficient device. Further, since there is virtually no injection of carriers into P substrate 100, these devices may conduct large currents at high voltages even when low voltage logic devices are formed on the same substrate.

The dimensions of one embodiment of the invention are given in FIG. 3. These dimensions may be varied, as would be well-known to those of ordinary skill in the art, to provide a bipolar transistor with the desired operating characteristics.

Since undesirable carrier injection into the substrate is prevented by the action of P catch diffusion region 150, epitaxial layer 110 may be made thinner than epitaxial layers in prior art devices with similar operating characteristics.

Figure 1:
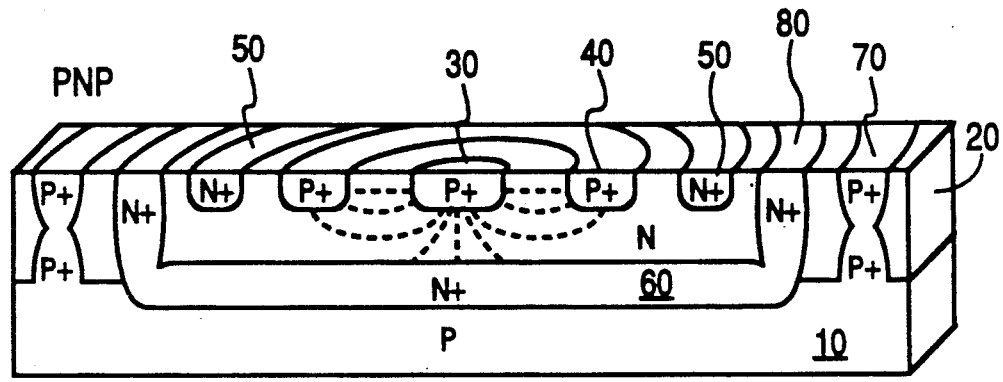
FIG. 1 shows a prior art high power, integrated PNP bipolar transistor with a buried region.
Figure 2:
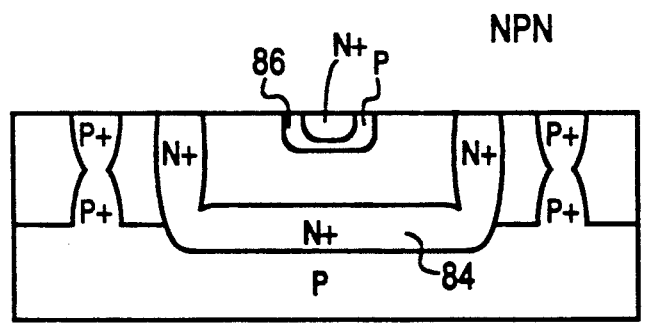
FIG. 2 shows a prior art low power, integrated NPN bipolar transistor with a buried collector region.

The structure of FIG. 3 may be fabricated using only one more step than used to fabricate the prior art device of FIG. 1. This additional step is a drive-in step to form N buried region 170 to a sufficient depth in substrate 100 prior to forming epitaxial layer 110. This enables P catch diffusion region 150 to be formed so as to be in direct contact with N epitaxial layer 110 while being isolated from P substrate 100 by N buried region 170.

A preferred method for forming the device of FIG. 3 is described below with respect to FIGS. 4-6.

Figure 4:
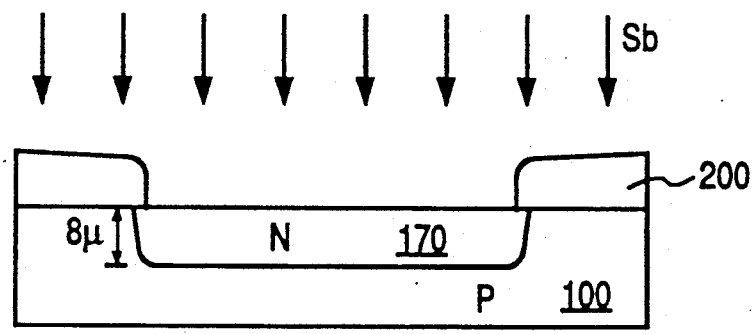
FIGS. 4-6 illustrates the novel steps in a preferred method for forming the device of FIG. 3.

FIG. 4 illustrates P substrate 100, having a resistivity of approximately 5 ohm-cm in one embodiment. P substrate 100 is appropriately masked with oxide 200, and Antimony (Sb) ions are implanted at approximately 80 KeV at a dose of approximately $5 \times 10^{15}/cm^2$. The N type Sb dopants are then driven-in for approximately 8 to 10 hours at a temperature of approximately 1250° C. until the dopants are driven in to a depth of approximately 8 microns to form N buried layer 170. The resulting dopant concentration in N buried layer 170 will be approximately $10^{19}/cm^3$.

Figure 5:
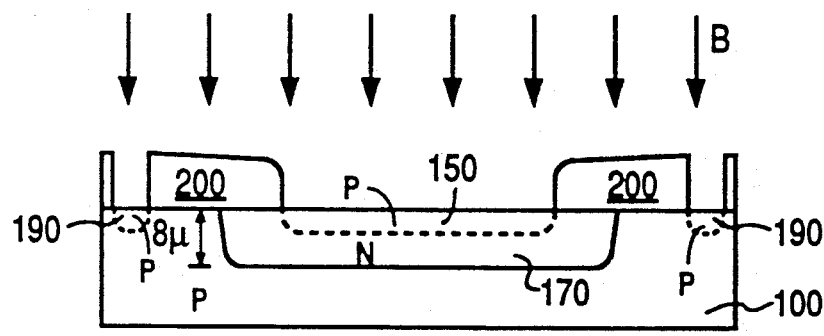

FIG. 5 illustrates the next step of masking the resulting substrate using oxide 200 and implanting P type Boron ions into a center portion 150 of N buried layer 170. The implanted Boron dopants, prior to drive-in, are shown within dashed lines in FIG. 5. This implanting step may also be used to implant dopants 190 which will form P+ sinkers for isolation. The approximate concentration of Boron dopants in these regions is $10^{17}/cm^3$.

Figure 6:
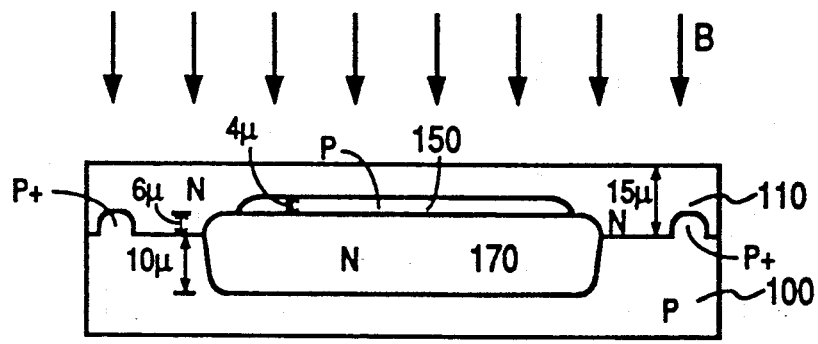

In FIG. 6, an N type epitaxial layer 110 having a resistivity of approximately 3 ohms-cm is then grown over the surface of the substrate at approximately 1200° C. until epitaxial layer 110 is approximately 15 microns thick. During this epitaxial layer growing process, the Boron dopants implanted in FIG. 5 are driven approximately 10 microns up into epitaxial layer 110, while the slower-diffusing Antimony dopants diffuse up only approximately 6 microns into epitaxial layer 110, leaving a P catch diffusion region 150 approximately 4 microns above N buried region 170, as shown in FIG. 6. The N type Antimony dopants in buried layer 170 also diffuse only approximately 2 microns further down into substrate 100, since Antimony diffuses slowly and these dopants have already been driven in during the previous drive-in step discussed with respect to FIG. 4.

The N type Antimony concentration in N buried region 170 is over two orders of magnitude higher than the boron concentration in P catch diffusion region 150, so the Antimony overwhelms the Boron where these two dopant diffusions overlap. However, as shown in FIG. 6, due to the faster diffusion of Boron, a 4 micron Boron diffusion front does not overlap the Antimony and thus forms P catch diffusion region 150.

Due to these differing diffusion rates, the resulting P catch diffusion layer 150 has a top portion directly contacting epitaxial layer 110 but has bottom and side portions insulated from substrate 100 by N buried layer 170.

After epitaxial layer 110 is grown, the surface of the epitaxial layer is selectively implanted with Boron dopants and then heated to drive-in these Boron dopants so as to form P+ return region 160 (FIG. 3) for contacting P catch diffusion region 150, and to form P+ region 190 for isolation.

If desired, N+ sinkers 180 in FIG. 3 may also be formed, using fast diffusing Phosphorus dopants, to contact N buried layer 170.

A conventional masking and implantation step is then used to form P+ emitter 120 and, optionally, lateral P+ collector regions 130. N+ base contact region 140 is then formed. These dopants will be driven-in during any remaining metallization and passivation steps.

Accordingly, an improved high power, integrated, lateral, PNP bipolar device has been described which reduces the injection of carriers into a substrate, improves the efficiency of the device, eliminates the parasitic PNP transistor to the substrate, and is relatively simple to fabricate.

While particular embodiments of the present invention have been shown and described, it will be obvious to those skilled in the art that changes and modifications may be made without departing from this invention in its broader aspects. For example, all fabrication processes described herein may be substituted with other suitable processes, such as substituting a predeposition process for an ion implantation process. Further, slow diffusing Arsenic dopants may be substituted for Antimony dopants to form the N buried layer. Therefore, the appended claims are to encompass within their scope all such changes and modifications as fall within the true spirit and scope of this invention.

What is claimed is:

1. A high voltage bipolar transistor structure comprising:
   a substrate of a first conductivity type;
   an epitaxial layer of a second conductivity type formed over said substrate;
   a first buried region of said second conductivity type formed in said substrate;
   a first sinker region of said second conductivity, more heavily doped than said epitaxial layer, extending from a top surface of said epitaxial layer and directly contacting said first buried region;
   a second buried region of said first conductivity type formed within said substrate so as to be completely isolated from said substrate by said first buried region and in direct contact with said epitaxial layer;
   a second sinker region of said first conductivity type extending from said top surface of said epitaxial layer and directly contacting said second buried region; and
   an emitter region of said first conductivity type formed in said top surface of said epitaxial layer and being located over said second buried region,
   said second buried region and said second sinker region together acting as collector region, and said epitaxial layer acting as a base, for a bipolar transistor.

2. The transistor of claim 1 wherein said transistor is a PNP bipolar transistor 3. The transistor of claim 1 wherein a collector region of said first conductivity type is formed in said top surface of said epitaxial layer and surrounding said emitter region.

4. The transistor of claim 1 wherein said first sinker region of said second conductivity type is connected to a bias voltage to prevent said first buried region from becoming forward biased with respect to said substrate.

5. The transistor of claim 1 wherein said first sinker region of said second conductivity type is connected to a bias voltage to reverse bias said first sinker region and said first buried region with respect to said second buried region and said second sinker region.

* * * * *